United States Patent [19]

Sugimoto et al.

[11] Patent Number: 5,072,289

[45] Date of Patent: Dec. 10, 1991

[54] WIRING SUBSTRATE, FILM CARRIER, SEMICONDUCTOR DEVICE MADE BY USING THE FILM CARRIER, AND MOUNTING STRUCTURE COMPRISING THE SEMICONDUCTOR DEVICE

[75] Inventors: Masakazu Sugimoto; Kazuo Ouchi; Mikio Aizawa; Atsushi Hino; Kazuto Shinozaki; Tetsuya Terada; Takanori Miyoshi; Munekazu Tanaka; Shoji Mrita; Amane Mochizuki; Yoshinari Takayama, all of Osaka, Japan

[73] Assignee: Nitto Denko Corporation, Osaka, Japan

[21] Appl. No.: 433,108

[22] Filed: Nov. 8, 1989

[30] Foreign Application Priority Data

| Nov. 9, 1988 | [JP] | Japan | 63-283207 |
| Mar. 1, 1989 | [JP] | Japan | 1-50792 |
| Mar. 1, 1989 | [JP] | Japan | 1-50793 |
| Jul. 14, 1989 | [JP] | Japan | 1-181272 |
| Jul. 28, 1989 | [JP] | Japan | 1-197680 |
| Jul. 28, 1989 | [JP] | Japan | 1-197681 |
| Jul. 28, 1989 | [JP] | Japan | 1-197682 |
| Aug. 2, 1989 | [JP] | Japan | 1-200847 |

[51] Int. Cl.[5] .......................................... H01L 23/48
[52] U.S. Cl. ........................................ 357/68; 357/80; 357/66
[58] Field of Search ............................ 357/80, 68, 66

[56] References Cited

U.S. PATENT DOCUMENTS

| 3,868,724 | 2/1975 | Perrino | 357/653 |
| 4,721,995 | 1/1988 | Tanizawa | 357/80 |
| 4,774,633 | 9/1988 | Dehaine | 357/80 |
| 4,926,241 | 5/1990 | Carey | 357/80 |

OTHER PUBLICATIONS

Patent Abstracts of Japan, vol. 10, No. 209 (E-421)(2265) 22 Jul. 1986, & JP-A-61 48952 (Toshiba) 10 Mar. 1986.
IBM Technical Disclosure Bulletin, vol. 30, No. 9, Feb. 1988, New York, U.S., pp. 353-354; "Process for Making a Self-Alignd Removable VLSI Connector", European Search Report.

Primary Examiner—Eugene R. Laroache
Assistant Examiner—R. Ratliff
Attorney, Agent, or Firm—Sughrue, Mion, Zinn, Macpeak & Seas

[57] ABSTRACT

A wiring substrate, a film carrier, a semiconductor deice made by using the film carrier, and a mounting structure comprising the semiconductor device are disclosed The wiring substrate comprises:
a conductor pattern which has a bonding pad and is formed on the rear surface of an insulating support;
at least one of minute through-holes which are provided in a region of the insulating support where the bonding pad is in contact therewith, or which are provided a region of the insulating support where the bonding pad is in contact therewith and in the vicinity of the region, the through-holes running in the direction of the thickness of the insulating support;
a conductive passage which is made of a metal material and which is formed in the through-holes that are provided in a region of the insulating support where the bonding pad is in contact therewith; and
a bump-like metal protrusion which is formed on the conductive passage and which is protruded from the front surface of the insulating support.

16 Claims, 8 Drawing Sheets

FIG. 8
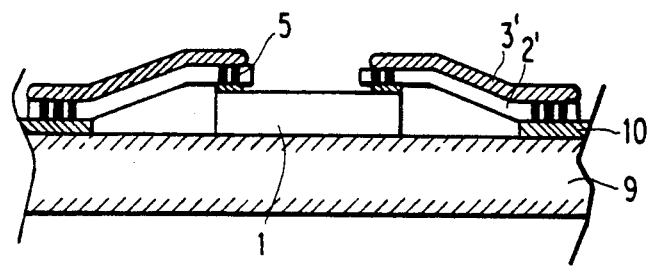
FIG. 9(a)            FIG. 9(b)
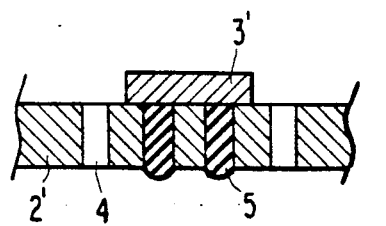    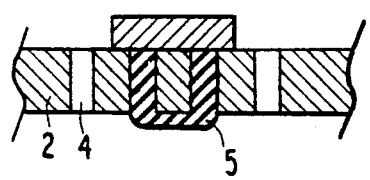
FIG. 10
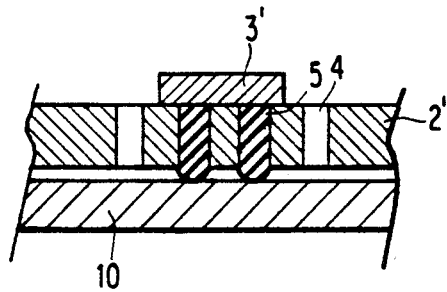

WIRING SUBSTRATE, FILM CARRIER, SEMICONDUCTOR DEVICE MADE BY USING THE FILM CARRIER, AND MOUNTING STRUCTURE COMPRISING THE SEMICONDUCTOR DEVICE

FIELD OF THE INVENTION

The present invention relates to a wiring substrate, as well as a film carrier, and more particularly to a semiconductor device made by using the film carrier, as well as a mounting structure comprising the semiconductor device.

BACKGROUND OF THE INVENTION

A conventional method for mounting a semiconductor element on a substrate for a circuit by means of wireless bonding includes a method in which a conductive bump is formed on an electrode surface of the semiconductor element, and then the bump is bonded to a bonding pad formed on the substrate; and a method in which a conductive bump is formed on a bonding pad of the substrate, and then the bump is bonded to an electrode surface of the semiconductor element. Such methods are disclosed in JP-A-50-10476 and JP-A-50-160774 (The term "JP-A" as used herein means an "unexamined published Japanese patent application").

However, the former method is poor in production efficiency because it is necessary to form the bump on the electrode surface of the semiconductor element in advance, so that the semiconductor element becomes contaminated and damaged. In addition, both methods require greater alignment accuracy in the bonding step of the semiconductor element.

Recently, with the development of electronic equipment which is thinner and miniaturized, there has been a growing demand for thinning the wiring substrate. In order to form such a package, there is adopted a TAB (i.e., tape automated bonding) method in which a film carrier is used.

A variety of inner lead bonding methods in which a semiconductor element is bonded to a finger-like lead. Among these inner lead are known bonding methods, there has been proposed a method in which a bump (i.e., a protruding electrode) is formed on the electrode surface of a semiconductor element, and a lead provided on a film carrier is bonded to the semiconductor element by way of the bump.

However, the method using the bump provided on the electrode surface requires complex processes comprising forming a contact layer made of metals such as titanium or chromium and a barrier layer made of metals such as copper, platinum, or palladium on the electrode, which prevents the bump metal from being. Sputter etching or evaporation, etc., respectively, are used, followed by forming a bump using, e.g., plating with gold. In addition, using this method, it is difficult to eliminate contamination or damage to the semiconductor device.

Also, there has been proposed a method in which a bump is bonded to a lead provided on a film carrier, however, it also requires complex processes for forming the bump like the above method.

Recently a bumpless film carrier having an anisotropic conductive film has been proposed as shown in JP-A-63-4633. Such an anisotropic conductive film is produced by a method in which conductive particles such as carbon black, graphite, nickel, copper, silver, etc. are dispersed in an insulating resin film and the conductive particles are oriented in the direction of the thickness of the film. A complex manufacturing method is necessary to obtain a homogeneous anisotropic conductive film. Also, when the orientation of the conductive particles is insufficient, inner lead bonding is insufficiently conducted so that the reliability for connecting may be reduced.

On the other hand, when the semiconductor device obtained by conducting the inner lead bonding is connected to an outer substrate such as a package substrate or a case using an outer lead bonding method, there are problems similar to those described above.

Namely, when a semiconductor device is mounted on an outer substrate by means of an outer lead bonding method, a linear connecting lead made of conductive metals, such as copper is used. This connecting lead is formed on a film carrier constituting the semiconductor device, and is connected to a metal wiring unit (i.e., a land portion).

However, such a mounting method requires that cutting or bending is conducted with respect to a connecting lead, so that operating efficiency is poor and connection is difficult. Since the connecting lead protrudes from the film carrier, it is poor in mechanical strength as well as operating efficiency. Thermal connecting methods such as a reflow soldering method are adopted for connecting the lead to the land portion. For example, when a semiconductor device is mounted on a transparent electrode made of metal oxides such as a liquid crystal panel, it is necessary to metalize the upper surface of the transparent electrode in advance so that soldering can be carried out.

Recently, there have been proposed methods in which a film carrier is connected to an outer substrate using an anisotropic conductive film or paint as shown in JP-A-63-34936. However, such methods require high alignment accuracy and lead to high costs.

SUMMARY OF THE INVENTION

The present invention is intended to overcome the above noted problems inherent in the prior art.

An object of the present invention is therefore to provide a technique for a wiring substrate, specifically a wiring substrate and a film carrier, and a semiconductor device made by using the film carrier, and a mounting structure provided with the semiconductor device, wherein a bump can be formed with high precision and at a low cost, and the miniaturization of such products can be easily achieved.

The above and other objects of the present invention will be more apparent from the following description.

The present inventors have attempted to overcome the above problems and have consequently found that when an insulating support, preferably an insulating film, comprising minute through-holes penetrating through the upper and lower surfaces of the film and a bump-like metal protrusion which is formed in the through-holes and protrudes from one surface of the film is used, a wiring substrate as well as a film carrier which can attain the above-noted objects can be obtained. Also, a semiconductor device made by using the film carrier, and a mounting structure provided with the semiconductor device can be obtained so as to attain the abovenoted objects.

According to one aspect of the present invention, there is provided a wiring substrate comprising:

a conductor pattern which has a bonding pad and is formed on the rear surface of an insulating support;

at least one of minute through-holes which are provided in a region of the insulating support where the bonding pad is in contact therewith, or which are provided in a region of the insulating support where the bonding pad is in contact therewith and the vicinity of the region, the through-holes running in the direction of the thickness of the insulating support;

a conductive passage which is made of a metal material and which is formed in the through-holes that are provided in a region of the insulating support where the bonding pad is in contact therewith; and a bump-like metal protrusion which is formed on the conductive passage and which is protruded from the front surface of the insulating support.

According to another aspect of the present invention, there is provided a method for manufacturing a wiring substrate comprising:

(a) forming a conductor pattern having a bonding pad on at least one surface of an insulating support;

(b) forming, in a region of the insulating support where the bonding pad is in contact therewith, or in a region of the insulating support where the bonding pad is in contact therewith and the vicinity of the region, at least one of minute through-holes being apart from each other with a distance smaller than the width of the bonding pad and running in the direction of the thickness of the insulating support; and (c) conducting electroplating using the conductor pattern as an electrode after masking the surface of the insulating support on which the conductor pattern is formed, thereby depositing and growing a metal material in the through-holes that are formed in a region of the insulating support where the bonding pad is in contact therewith, so that a conductive passage is formed in the through-holes, and subsequently forming a bump-like metal protrusion on the conductive passage.

According to still another aspect of the present invention, there is provided a film carrier comprising:

an insulating film having a lead on one surface thereof;

at least one of minute through-holes which are provided in a region of the insulating film where the lead is in contact therewith, or which are provided in a region of the insulating film where the lead is in contact therewith and which are provided in the vicinity of that region, the through-holes running in the direction of the thickness of the insulating film;

a conductive passage which is made of a metal material which is formed in the through-holes that are provided in a region of the insulating film where the lead is in contact therewith; and a bump-like metal protrusion which is formed on the conductive passage and which is protruded from the opposite side of the surface of the insulating film on which the lead is formed.

According to yet another aspect of the present invention, there is provided a semiconductor device made by connecting a semiconductor element to the above film carrier.

According to further aspect of the present invention, there is provided a mounting structure of a semiconductor device comprising an outer substrate and the above semiconductor device obtained by connecting a semiconductor element to a film carrier comprising an insulating film having a lead on one surface thereof, the mounting structure comprising:

at least one of minute through-holes which are provided in a bonding region of the insulating film where a land portion of the outer substrate is in contact therewith, or which are provided in a bonding region of the insulating film where a land portion of the outer substrate is in contact therewith and the vicinity of the bonding region;

a metal material which is charged into the through-holes that are provided in the bonding region; and a bump-like metal protrusion formed on the metal material; the lead being connected to the land portion through the bump-like protrusion.

BRIEF DESCRIPTION OF THE DRAWINGS

FIG. 8 is a sectional view showing one embodiment of a mounting structure according to the present invention;

FIGS. 9(a) and 9(b) are respectively partially sectional views of an insulating film according to the present invention;

FIG. 10 is a sectional view showing a state in which a semiconductor device is mounted on a land portion by way of the bump-like metal protrusion shown in FIG. 9(a);

DETAILED DESCRIPTION OF THE INVENTION

The present invention can be more fully understood from the following detailed description when taken in conjunction with the accompanying drawings.

Figure 1:
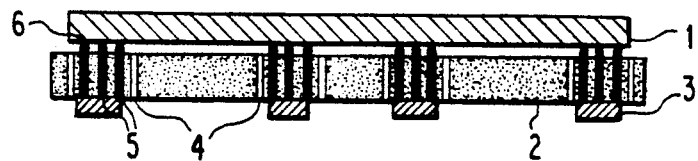
FIGS. 1 and 2 each are a cross sectional view showing one embodiment of a wiring substrate according to the present invention.
Figure 2:
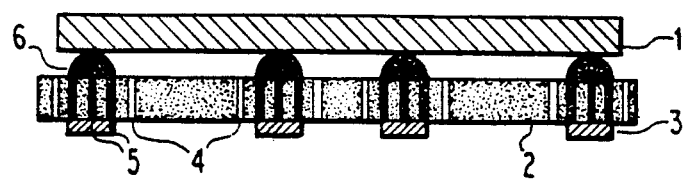

FIGS. 1 and 2 each are a cross sectional view showing one embodiment of a wiring substrate according to the present invention. In FIG. 1, a bump-like metal protrusion (i.e., a bump) 6 is formed in a through-hole 4 into which metal material 5 is packed. In FIG. 2, a bump 6 is formed so that a plurality of through-holes 4 packed with metal material 5 can be clogged simultaneously.

Each of the above drawings shows a wiring substrate in which a semiconductor element 1 is mounted thereon and is connected thereto, and in which an outer connecting electrode to be formed on a connecting surface of the semiconductor element 1 is omitted from the illustration.

In FIG. 1, a material constituting an insulating support 2 is not restricted to particular one if it has insulating properties, and can be used irrespective of thermosetting resins or thermoplastic resins. Examples of such a materials include polyester resins, epoxy resins, urethane resins, polystyrene resins, polyethylene resins, polyamide resins, polyimide resins, ABS resins, polycarbonate resins, and silicone resins.

A conductor pattern comprising a bonding pad 3 is made of metals such as gold, silver, copper, iron, nickel or cobalt; or alloys containing these metals as a major component. The conductor pattern can be formed on the insulating support 2 by the following methods. That is, (1) the conductor pattern may be formed on the insulating support by various evaporation methods, various plaing methods, etc.; (2) using a laminate of the insulating support and a metal layer, a part of the metal layer is removed by sputtering to form a conductor pattern on the insulating support; and (3) a solution of a material for the insulating support (such as a polyimide solution) is coated on a metal layer for a conductor pattern. The method (3) can also be used for producing the laminate used in the method (2).

Figure 3A:
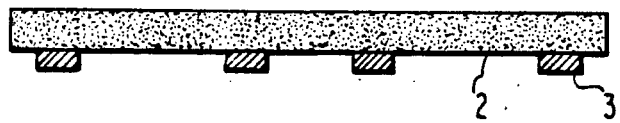
FIGS. 3(a) to 3(c) are schematic views manufacturing steps to obtain one embodiment of a wiring substrate of the present invention.
Figure 3B:
Figure 3C:
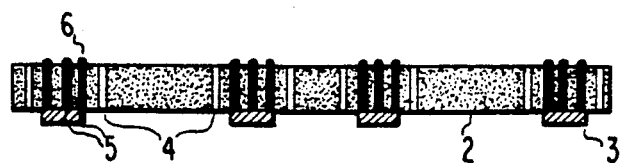

FIGS. 3(a) to 3(c) are schematic views embodying manufacturing steps to obtain the wiring substrate of the present invention.

FIG. 3(a) shows that the conductor pattern comprising the bonding pad 3 is formed on one surface of the insulating support 2.

FIG. 3(b) shows that in a region of the insulating support 2 where the bonding pad 3 is connected thereto and in the vicinity of that region, there are formed at least one of minute through-holes 4 which are apart from each other with a distance smaller than the width of the bonding pad, and run in the direction of the thickness of the insulating support.

The through-holes 4 can be formed by means of machining, laser, light, chemical etching, etc. It is preferred that the size of the through-holes 4 be made as large as possible, without the adjacent through-holes 4 being connected to each other in order to decrease the electric resistance of a metal material to be deposited in the through-holes in the following step.

The though-holes 4 may be provided not only in a region of the insulating support 2 where the bonding pad 3 is in contact therewith, but they also may be provided in both the region of the insulating support 2 where the bonding pad 3 is in contact therewith and the vicinity of that region.

FIG. 3(c) shows that the surface of the perforated insulating support 2 on which the conductor pattern is formed (i.e., the lower surface of the insulating support) is masked, and then electroplating is carried out by using the conductor pattern including the bonding pad 3 as an electrode, thereby depositing the metal material 5 in the through-holes 4 which is in contact with the bonding pad 3, followed by forming on the metal material 5 a bump-like metal protrusion 6 protruded from the upper surface of the insulating support 2.

In addition, the step shown in FIG. 3(c) may be carried out as follows. Namely, charging the metal material 5 is stopped when the thickness of the metal material reaches a predetermined value (generally from about 8 to 50 $\mu$m but depending on the thickness of the insulating support). While the insulating support 2 is kept masked, the insulating support is immersed in a solder bath, thereby charging the solder into the through-holes 4 which is partly filled with the metal material, followed by forming the bump-like metal protrusion by electroplating or applying ultrasonic vibration in a solder bath, for example. Also, solder may be applied to electroplating.

Figure 4:
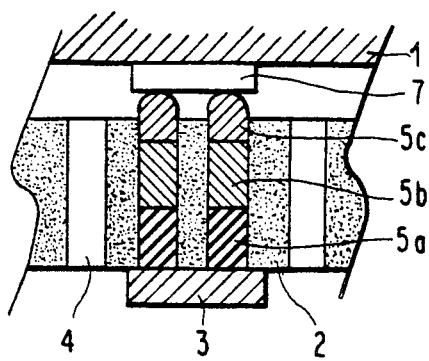
FIG. 4 is a cross sectional view showing another embodiment of a wiring substrate according to the present invention.

The metal material charged in the through-holes 4 and the bump-like metal protrusion are formed into a multi-layered structure using a plurality of metal materials. For example, as shown in FIG. 4, the first layer which is formed in the through-holes 4 and is in contact with the bonding pad 3 can be made of a cheap metal material 5a such as copper, and the third layer which is in contact with the semiconductor element 1 can be made of a metal material 5c such as gold having high reliability for connection, and the second layer interposed between the first layer and the third layer can be made of a metal material 5b such as nickel acting as a barrier which prevents reaction between the metal materials 5a and 5b.

The manufacturing steps for the wiring substrate shown in FIGS. 3(a) to 3(c) will be illustrated with reference to the following embodiments.

A conductor pattern consisting of copper layer of 35 $\mu$m thick was formed on one surface of a polyimide support of 20 $\mu$m thick. The width of a bonding pad included in the conductor pattern was 90 $\mu$m.

Excimer laser beam was irradiated on the surface opposite than that of the support on which the conductor pattern was formed through a shielding screen made of nickel having minute holes of 25 $\mu$m in diameter and spaced at 45 $\mu$m intervals, thereby forming through-holes reaching the conductor pattern. At this time, the region of the shielding screen in which the minute holes was formed was confined to the region of the support where the bonding pad was in contact therewith and confined to the vicinity of that support region so that the through-holes were formed as shown in FIG. 3(b).

The irradiation the with excimer laser beam was conducted under the following conditions: a wave length of 248 nm, a pulse energy of 250 mJ, a repetition rate of 100 Hz, and an ablation rate of 0.1 to 0.5 $\mu$m per one shot.

The surface of the conductor pattern was masked with a masking tape and electroplating with copper was carried out using the conductor pattern as an electrode, thereby depositing a copper layer in the through-holes. Finally, electroplating with gold was carried out to form the bump-like gold protrusion protruded from the support, thereby obtaining the wiring substrate according to the present invention.

It has turned out that when the wiring substrate thus obtained was electroplated, the metal layer was grown to form the bump-like protrusion, which clogs the through-holes formed in the region of the support in contact with the bonding pad as shown in FIG. 2.

In the same manner as the above embodiment, when copper was charged into the through-hole, charging the copper was stopped when the copper layer reached the surface of the insulating support, and the support was then immersed in a solder bath, applying ultrasonic vibration thereto to form the bump-like metal protrusion as shown in FIG. 4, thereby obtaining the wiring substrate according to the present invention.

Bonding was carried out to connect a semiconductor element to the wiring substrate thus obtained, thereby obtaining a semiconductor device with excellent electrical and mechanical connections.

In the present invention, it is preferred that an insulating support be used in the shape of an insulating film in order that the wiring substrate be made thinner; this is useful in the TAB method for packaging of semiconductor devices. Namely, a flexible film carrier can be used as a wiring substrate on which a semiconductor element is mounted. The present invention can advantageously be applied to such a flexible film carrier and semiconductor device.

Figure 5:
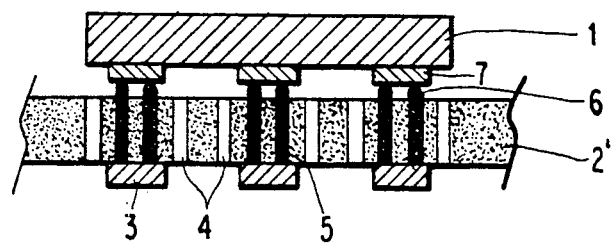
FIG. 5 is a cross sectional view showing one embodiment of a semiconductor device manufactured by using a film carrier according to the present invention.

FIG. 5 is a cross sectional view showing one embodiment of a semiconductor device manufactured by using a film carrier according to the present invention.

As shown in FIG. 5, in the same manner as FIG. 1, a plurality of through-holes 4 are formed in a region of a insulating film 2' where a lead 3' is in contact therewith as well as in the vicinity of the region. Only the through-holes 4 that are formed in a region of the insulating film where the lead 3' is in contact therewith are filled with a metal material 5, and a bump-like metal protrusion 6 is provided thereon.

The bump-like metal protrusion 6 is connected to an outer connecting electrode 7 such as an aluminum electrode formed on one surface of the semiconductor element 1, thereby obtaining a semiconductor device.

In FIG. 5, material constituting insulating film 2', as in the case of the insulating support 2, is not restricted to particular one if it has insulating properties, and any thermosetting resins or thermoplastic resin may be used. Examples of such material include polyester resins, epoxy resins, urethane resins, polystyrene resins, polyethylene resins, polyamide resins, polyimide resins, ABS resins, polycarbonate resins, and silicone resins. Among these, a film made of polyimide resins is particularly preferred from the standpoints of heat-resistant property and mechanical strength.

The lead 3' to be provided on one surface of the insulating film 2' is made of a insulating material including metals such as gold, silver, copper, nickel or cobalt; or alloys containing these metals as a major component and is electrically connected to the semiconductor element 1. The lead 3' is also formed into a desired linear pattern so that the semiconductor element 1 can function properly.

The through-holes 4 to be formed in the insulating film 2' are important in order to connect the lead 3' to the outer connecting electrode 7. Therefore, in a region of the insulating film 2' where the lead 3' is connected thereto and in the vicinity of that region, there are formed at least one of minute through-holes 4 which are apart from each other a distance smaller than the width of the lead 3' and which run in the direction of the thickness of the insulating film 2'.

The through-holes 4 are formed by means of machining processing, laser processing, light processing, chemical etching, etc., so that a desired hole size and a desired distance between holes can be obtained. Irradiation with an excimer laser beam is preferably used for forming the through-holes. It is preferred that in order to decrease the electric resistance of a metal material to be deposited in the through-holes in the following step, the size of the through-holes 4 is made as large as possible without the adjacent through-holes 4 being connected to each other, and the distance between holes is made as small as possible to increase the number of the through-holes 4 which are in contact with the lead.

Among such through-holes 4 thus obtained, in the through-holes that are formed in the region of the insulating film where the lead 3' is in contact therewith, there is formed a conductive passage by charging the metal material 5 therein. A bump-like metal protrusion having a height of several micrometers to tens of micrometers (for example, from about 0.5 to 100 $\mu$m, preferably from about 10 to 80 $\mu$m, but depending on the intended use) is formed on the metal material 5, thereby obtaining the film carrier of the present invention.

The conductive passage made of the metal material 5 and the bump-like metal protrusion are formed only in the through-holes that are in contact with the lead 3' by conducting electroplating using the lead 3' as an electrode.

The metal material charged in the through-holes 4 and the bump-like metal protrusion, which are provided in the film carrier of the present invention, may be formed into a multi-layered structure as in FIG. 4 made of a plurality of metal materials as in the case of the wiring substrate of the present invention.

The bump-like metal protrusion 6, which constitutes the film carrier, is connected to an outer connecting electrode 7 formed on one surface of the semiconductor element 1, thereby obtaining the desired semiconductor device.

FIGS. 6(a) to 6(e) are views showing a sequence of process steps to manufacture a semiconductor device in which the semiconductor element 1 is connected to a film carrier made by providing a thermal adhesive resin layer 8 on a surface of the insulating film 2' on which the bump-like metal protrusion is formed.

Figure 6A:
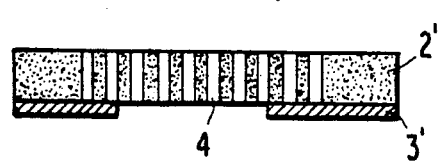
FIGS. 6(a) to 6(e) are views showing a sequence of process steps to manufacture a semiconductor device according to the present invention.

FIG. 6(a) is a sectional view wherein the through-holes 4 are provided in the insulating film 2' with the lead 3' in the same manner as in FIG. 3(b).

Figure 6B:
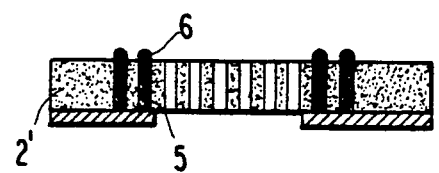

FIG. 6(b) is a sectional view wherein in order to change the through-holes contacting the lead 3' into a conductive passage, the through-holes are filled with the metal material 5 on which the bump-like metal protrusion 6 is formed.

Figure 6C:
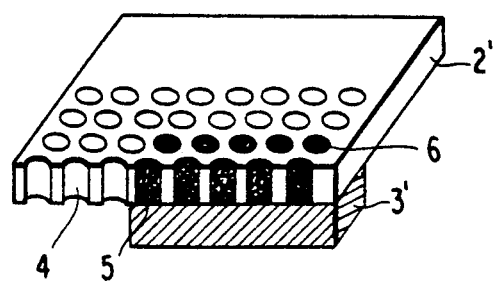

FIG. 6(c) is a perspective view of FIG. 6(b).

Figure 6D:
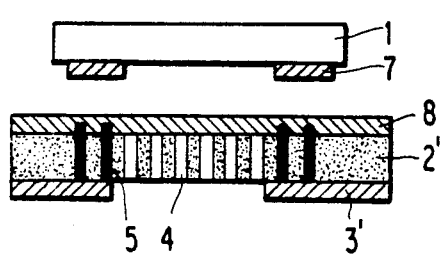

FIG. 6(d) is a sectional view wherein the thermal adhesive resin layer 8 is provided on the surface of the insulating film so as to cover the bump-like metal protrusion 6.

Figure 6E:
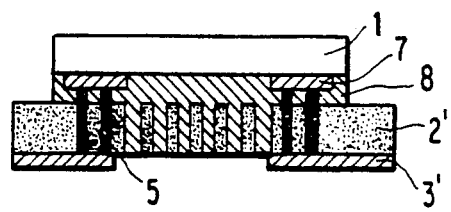

FIG. 6(e) is a sectional view of a semiconductor device which has the semiconductor element 1 connected thereto.

In FIG. 6(d), the thermal adhesive resin layer 8 covering the top of the bump-like metal protrusion 6 is removed due to its spreading when thermocompression bonding is carried out as shown in FIG. 6(e), so that the bump-like metal protrusion 6 is electrically connected to the outer connecting electrode 7 formed on the semiconductor element 1. At this time, the thermal adhesive resin of the resin layer 8 is introduced into and filled with the through-holes that are not charged with the metal material.

The thermal adhesive resin layer 8 is not necessarily provided on the insulating film in such a way as to cover the bump-like metal protrusion 6 as shown in FIG. 6(d), instead, it may be made thinner so that the upper portion of the bump-like metal protrusion can be exposed.

The thermal adhesive resin layer 8 used in the present invention is extremely important in order to increase the electrical, mechanical, and chemical reliability of the semiconductor device. The material of the resin layer 8 can be chosen from of thermosetting resins such as epoxy resins or thermoplastic resins such as fluorine-contained resins. Examples of such material include polyimide resins, epoxy resins, silicone resins and fluorine-contained resins.

The thermal adhesive resin layer 8 can be formed by coating the entire surface of the insulating film on which the bump-like metal protrusion is provided with the resin material or by coating the insulating film surface so that the coated resin material can form a definite pattern. In addition, the resin layer 8 may be formed by putting a film-like or a ribbon-like thermal adhesive resin material on the insulating film.

When the semiconductor element 1 is connected to the film carrier by way of the thermal adhesive resin 8, a layer of thermal adhesive resin is formed between the film carrier and the semiconductor element, and the through-holes are filled with the adhesive resin, with the result that adhesion properties and electrical connections increase. Since the surface of the semiconductor device is protected by the resin layer, resin seal is effected simultaneously with the electrical connection, leading to simplification of process steps. Further, excess resins flow into the through-holes which are not charged with the metal material, thereby pushing air out from the through-holes. It follows that the film carrier does not crack, leading to high reliability.

Figure 7:
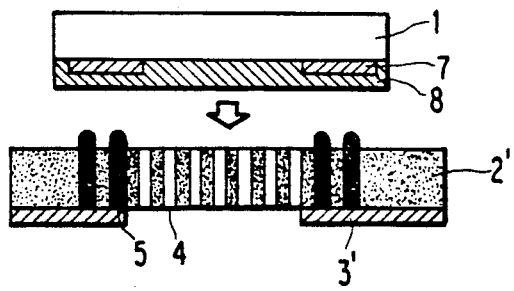
FIG. 7 is a view similar to that of FIG. 6(d)

In the present invention, the film carrier is electrically connected to the semiconductor element 1 by way of the outer connecting electrode 7 and the bump-like metal protrusion 6, thereby obtaining a semiconductor device. In order to increase the reliability of the above electrical connection, it is preferred that as shown in FIG. 6 the thermal adhesive resin layer 8 is interposed between the semiconductor element 1 and the film carrier. In FIG. 6(d), the thermal adhesive resin layer 8 is provided on the film carrier. However, the thermal adhesive resin layer 8 may be attached to a silicon wafer of the semiconductor element to which dicing is applied or not applied, and then it may be adhered to the film carrier, as shown in FIG. 7.

After the thermal adhesive resin is melted by heat or dissolved in a suitable solvent, it can be charged into the through-holes 4 which are not charged with the metal material 5, followed by drying it with heat to obtain the thermal adhesive resin layer 8. It follows that the surface of the semiconductor element 1 on which the outer connecting electrode 7 is provided and a connecting region at which the semiconductor element connects to the film carrier are completely covered and protected.

In addition, when the thermal adhesive resin is charged into the through-holes using the above method, air existing in a space in which the resin layer is to be formed is expelled from the space. As a result, voids are not formed in the resin layer thus produced, so that reliability is much improved.

The semiconductor device produced by using the film carrier according to the present invention is connected to the land portion of an outer substrate by way of a connecting lead, thus providing a mounting structure. This connection is referred to as an outer lead bonding.

FIG. 8 is a sectional view showing such a mounting structure.

In FIG. 8, the semiconductor element 1 is mounted on a film carrier comprising the insulating film 2' which has the connecting lead 3' on one surface thereof. The insulating film 2' has a bump-like metal protrusion (which is not shown in FIG. 8 and which is provided at the lower surface of the insulating film 2'). The insulating film 2' is connected to a metal wiring 10 (i.e., a land portion) on the outer substrate 9 by way of the bump-like metal protrusion.

FIGS. 9(a) and 9(b) are respectively partially sectional views of the insulating film in which the metal material 5 is charged into the through-holes 4 and a bump-like metal protrusion is provided on the metal material. FIG. 9(a) shows that the bump-like metal protrusion is formed in each of the through-holes 4 charged with the metal material 5. FIG. 9(b) shows that a plurality of through-holes 4 are connected each other by way of the common bump-like metal protrusion. FIG. 10 shows that a semiconductor device is mounted on the metal wiring 10 (i.e., a land portion) by way of the bump-like metal protrusion shown in FIG. 9(a).

Figure 11:
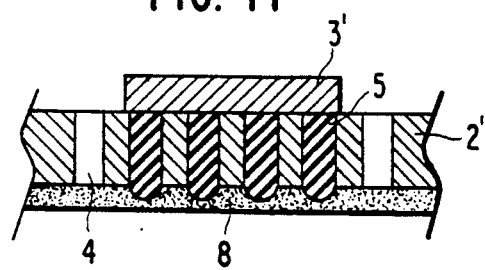
FIG. 11 is a view similar to that of FIG. 10 provided with a thermal adhesive resin layer.

In the mounting structure of the semiconductor device according to the present invention, it is preferred that a thermal adhesive resin layer is interposed between the semiconductor device and the outer substrate so the connecting region at which the semiconductor device connects to the outer substrate can be completely shielded from the open air and connecting reliability can be improved. For example, as shown in FIG. 11, it is preferred that the thermal adhesive resin layer 8 having a thickness of usually 5 to 50 μm, preferably 10 to 30 μm is provided on the surface of the insulating film 2' where the bump-like metal protrusion is formed, thereby producing a semiconductor device, and the semiconductor device thus obtained is connected to the land portion of an outer substrate. As shown in FIG. 11, the thermal adhesive resin layer 8 interposed between the film carrier and the outer substrate is formed in advance. However, the thermal adhesive resin layer may be formed by using a method in which a thermal adhesive resin is charged between a film carrier and an outer substrate through minute through-holes which are not filled with metal material.

Figure 12:
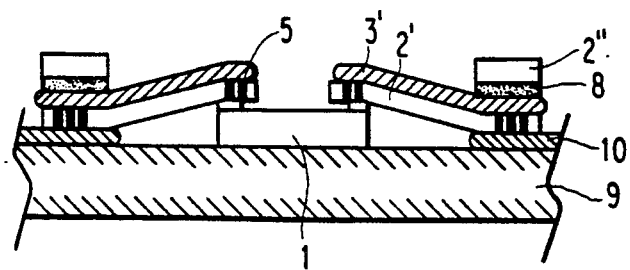
FIG. 12 is a sectional view showing another embodiment of a mounting structure according to the present invention.

FIG. 12 is a sectional view showing a mounting structure comprising a semiconductor device obtained by using such a method.

In FIG. 12, the semiconductor element 1 is mounted on the film carrier comprising the insulating film 2' having the lead 3' on one surface thereof. The insulating film 2' has a bump-like metal protrusion (which is not shown in FIG. 12 and which is provided at the lower surface of the insulating film 2'). The insulating film 2' is connected to the metal wiring 10 (i.e., a land portion) of the outer substrate 9 by way of the bump-like metal protrusion. The thermal adhesive resin layer 8 which is attached to the insulating film 2'' as a support is bonded under pressure to the lead 3' formed on the insulating film 2'.

Figure 13A:
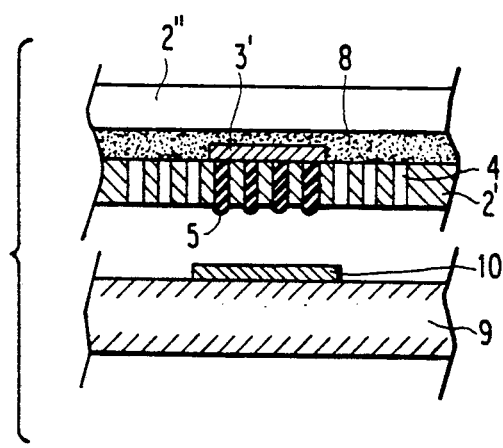
FIGS. 13(a) and 13(b) are respectively partial sectional views showing in a magnified fashion a method for obtaining the mounting structure shown in FIG. 12.
Figure 13B:
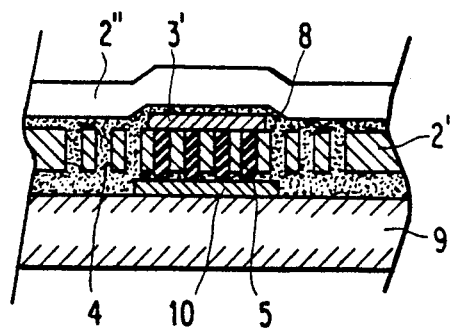

FIGS. 13(a) and 13(b) are respectively partially sectional views showing in a magnified fashion a method for obtaining the mounting structure shown in FIG. 12.

FIG. 13(a) shows a state prior to connection. FIG. 13(b) shows a state after connection. In FIG. 13(a), the adhesive layer 8 is provided on the insulating film 2" so that it can face the surface of the insulating film 2' having the connecting lead 3' thereon. Accordingly, the insulating film 2' can be bonded with pressure to the outer substrate 9 in such a way that the land portion 10 of the outer substrate 9 is connected to the bump-like metal protrusion. As a result, as shown in FIG. 13(b) an adhesive in the adhesive layer 8 is charged with pressure into a space between the outer substrate 9 and the insulating film 2' through the minute through-holes 4 which are not filled with the metal material, so that the land portion 10 and the vicinity thereof are covered with the adhesive resin. It follows that the electrical conduction is stabilized and the stabilization against mechanical and thermal shock is attained.

The insulating film 2" used as a support can be made of the same material as that of the above noted insulating film 2'.

The thermal adhesive resin may be charged with pressure by using any method if it can charge the resin into the through-holes. Particularly preferred is a hot press method in which the fluidity of the resin is raised by applying heat and the fluid resin is charged with pressure. The hot press method may be carried out under the conditions of pressure of 5 to 500 kg/cm$^2$, preferably 20 to 300 kg/cm$^2$ (when the outer substrate is made of a brittle material such as glass, the pressure is preferably about 5 to 100 kg/cm$^2$), temperature of 50° to 200° C., preferably 100° to 180° C. and time of 10 to 300 seconds, preferably 10 to 120 seconds.

It is preferred that as shown in FIG. 13, the thermal adhesive resin is used in a film-like shape from the standpoint of workability and the accuracy of charged amounts.

Figure 14:
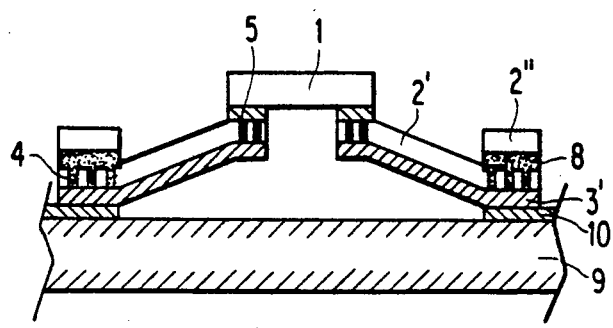
FIG. 14 is a sectional view showing still another embodiment of a mounting structure according to the present invention.

The mounting structure of the semiconductor device shown in FIGS. 8 and 12 according to the present invention is produced by connecting the lead 3' to the land portion 10 by way of the through-holes 4 filed with the metal material provided in the insulating film 2'.In addition to this, as shown in FIG. 14, the mounting structure of the semiconductor device according to the present invention can also be obtained by directly connecting the lead 3' to the land portion 10. In the mounting structure shown in FIG. 14, since a metal material need not be charged into the through-holes provided in a region of the insulating film where outer bonding (i.e., the land portion) is to be conducted, manufacturing steps can be reduced.

FIG. 14 is a sectional view showing another embodiment of the mounting structure according to the present invention.

In FIG. 14, the semiconductor element 1 is mounted on the film carrier comprising the insulating film 2' having the connecting lead 3' on one surface thereof. The connecting lead 3' formed on the insulating film 2' having the through-holes 4 is directly connected to the land portion 10 provided on the outer substrate 9. When this connection is carried out, thermal adhesive resin is charged with pressure into the through-hole 4, so that a connecting region and the vicinity thereof are reinforced and covered with the resin. The semiconductor element 1 is electrically connected to the connecting lead 3' by way of the metal material 5 filled in the through-holes 4 of the insulating film 2' as in the case of FIG. 5. However, such connection may also be carried out using such a bump as used in conventional methods.

Figure 15A:
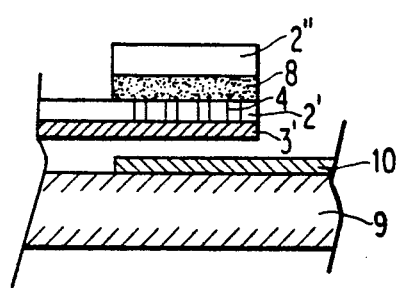
FIG. 15(a), FIG. 15(b), FIG. 16(a), and FIG. 16(b) are respectively enlarged sectional views showing a method in which the film carrier shown in FIG. 14 is connected to the land portion of an outer substrate.
Figure 15B:
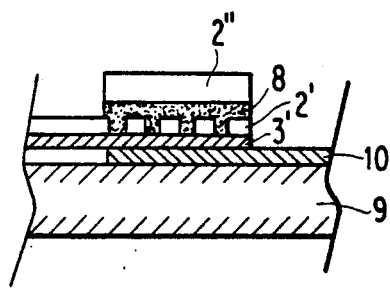
Figure 16A:
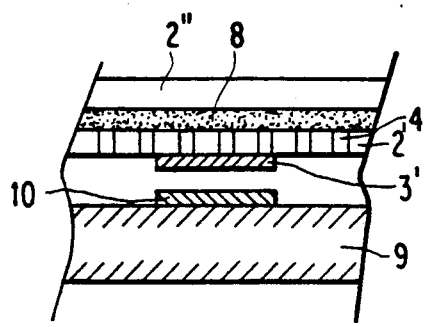
Figure 16B:
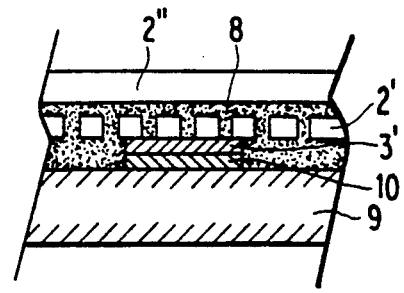
Figure 17A:
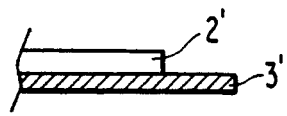
FIGS. 17(a) to FIG. 20(b) are sectional views showing a connecting lead having openings or recesses.

FIG. 15(a), FIG. 15(b), FIG. 16(a), and FIG 16(b) are respectively enlarged sectional views showing a method in which the film carrier shown in FIG. 14 is connected to the land portion of the outer substrate. Specifically, FIG. 15(a) and FIG. 1 '(a) show a state prior to connection in which the therm adhesive resin layer 8 is formed on the opposite side of the surface of the insulating film 2' on which the connecting lead 3' is provided FIG. 15(b) and FIG. 16(b) show a state after connection in which the thermal adhesive resin is charged with pressure into a space between the film carrier and the outer substrate 9 by way of the through-holes 4, so that a connecting region and the vicinity thereof are covered with the resin.

Incidentally, FIG. 15(a) and FIG. 15(b) show that the sectional views are those taken in the direction parallel to that of the connecting lead. FIG. 16(a) and FIG. 16(b) show that the sectional views are those taken in the direction perpendicular to that of the connecting lead.

In the mounting structure of the semiconductor device as shown in FIG. 14 to FIG. 16, the minute through-holes 4 are provided in the vicinity of a region of the insulating film where the connecting lead 3' is connected to the land portion 10 of the outer substrate 9. However, instead, openings or recesses having a larger size than that of the through-holes may be provided, so the thermal adhesive resin can be easily charged. Examples of such openings or recesses are shown in FIG. 17 to FIG. 20. In each of these figures, (a) shows a sectional view, and (b) shows a plan view.

Such openings or recesses can be formed using mechanical processing, laser processing, light processing, and chemical etching, etc. Among these processing methods, irradiation with an excimer laser beam is preferably adopted.

Figure 18A:
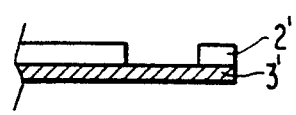
Figure 17B:
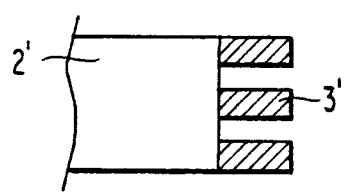
Figure 18B:
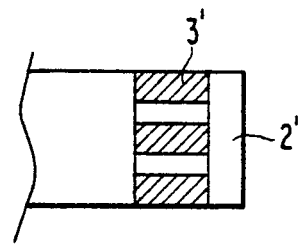
Figure 19A:
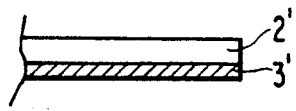
Figure 20A:
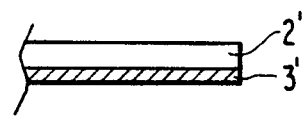
Figure 19B:
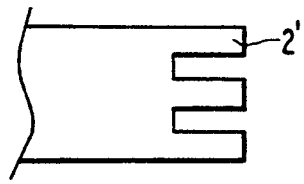
Figure 20B:
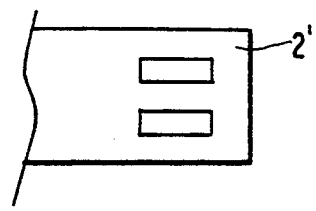

It is preferred that the connecting lead 3' is processed to form such a shape having no free ends as shown in FIG. 18 to FIG. 20 from the stand point of the covering and reinforcement of the lead.

As mentioned above, according to the present invention there are provided a wiring substrate or a film carrier in which a conductor pattern (or a connecting lead) is formed on the one surface of an insulating support (or a insulating film); at least one of minute through-holes are provided in a region of the insulating support (or the insulating film) where the conductor pattern (or connecting lead) is in contact therewith and in the vicinity of that region; a conductive passage is formed in the through-holes provided in a region of the insulating support (or the insulating film) where the conductor pattern (or the connecting lead) is in contact therewith; and a bump-like metal protrusion is formed on the conductive passage.

Therefore, when a semiconductor element is connected to the wiring substrate or the film carrier, alignment accuracy can be greater improved. Since anisotropic conductive films or paints, which are expensive, are not used, lower costs result, and the reliability of electric connection is also improved.

The electric connection area is free to be designed by selecting the size of the through-holes and the distance between holes, with the result that the miniaturization of the connection area can be realized.

Most importantly, when the thermal adhesive resin layer is used, the connecting region and the vicinity thereof are completely shielded from the open air, with the result that both connecting reliability and connecting strength can be further increased.

When the semiconductor device produced by using the film carrier is mounted on the outer substrate, the reliability of the electrical connection is improved and alignment can be easily conducted since such an insulating film having conductive through-holes therein is connected to the semiconductor element. When the thermal adhesive resin layer is interposed between the semiconductor device and the outer substrate, the electrical conduction is strengthened and the stabilization against mechanical and thermal shock is attained. Further, since the connecting portion and the vicinity thereof are covered with the thermal adhesive resin, even a semiconductor device having a number of pins, leakage of current will not occur between pins, thereby producing an extremely high level of connection reliability.

Contrary to prior arts in which a connecting lead is alone exposed in the space of a semiconductor device, in the film carrier of the present invention, the lead is supported on the insulating film, so that the bending strength of the lead itself increases and the bending and breaking of the lead will not occur. It follows that operating efficiency and productivity are improved.

The following experiment has been performed to illustrate the bending strength of the lead according to the present invention.

A polyimide precursor solution was coated on a copper foil of 17 $\mu$m thick so as to have a coating thickness of 25 $\mu$m and hardened, thereby forming a two layered film which acts as the support of a film carrier. A resist was coated on the surface of the film on which the copper foil was formed, and then exposing, developing, and etching were conducted to form a pattern having a lead portion thereon. The width of the lead was 60 $\mu$m. Dry etching was effected to the surface of the support on which the copper foil was provided using a laser beam having an output in the ultraviolet regions, so that part of the insulating film (i.e., polyimide film) interposed between leads was removed, thereby obtaining the film carrier in which the insulating film remained on the back surface of the lead. The transverse cross section of the insulating film was a trapezoidal having a upper base of 80 $\mu$m and a lower base of 60 $\mu$m.

It was found that when a film carrier having 120 leads was produced using the above method, bending or breaking of leads did not occur, whereas in a conventional film carrier in which leads were exposed, breaking occurred in 24 leads.

It is preferred that in order to secure connection with the bump-like metal protrusion provided at the insulating film, after the bump-like metal protrusion is formed, a part of the insulating film which surrounds the metal protrusion is removed by etching, so that the thickness of the insulating film is made thin, thus increasing the height of the bump-like metal protrusion. In this case, it is preferred that the thickness of the insulating film be reduced so it can be 5 to 200% of the bump diameter, to achieve a balance between bending strength and connection reliability.

While the invention has been described in detail and with reference to specific embodiments thereof, it will be apparent to one skilled in the art that various changes and modifications can be made therein without departing from the spirit and scope thereof.

We claim:

1. A wiring substrate comprising:

a conductor pattern which has a bonding pad and is formed on the rear surface of an insulating support;

at least one of minute through holes in a region of said insulating support where said bonding pad is in contact therewith, or in a region of said insulating support where said bonding pad is in contact therewith and the vicinity of said region, said through holes running in the direction of the thickness of said insulating support;

a conductive passage made of a metallic material and formed in said through holes in a region of said insulating support where said bonding pad is in contact therewith; and, a bump-like metal protrusion which is formed integrally with the conductive passage in the through-hole and which protrudes from the front surface of said insulating support.

2. The wiring substrate according to claim 1 wherein said insulative support is made of a polyimide film 3. A film carrier comprising:

an insulating film having a lead on one surface thereof;

at least one of minute through holes in a region of said insulating film where said lead is in contact therewith, or in a region of said insulating film where said lead is in contact therewith and the vicinity of said region, said throughholes running in the direction of the thickness of said insulating film;

a conductive passage made of a metallic material which is formed in said through holes in a region of said insulating film where said lead is in contact therewith; and a bump-like metal protrusion formed integrally with said conductive passage in the through hole and which protrudes from the opposite side of the surface of said insulating film on which said lead is formed.

4. The film carrier according to claim 3, wherein said conductive passage is formed by depositing a metal material.

5. The film carrier according to claim 4, wherein said metal material is deposited by plating.

6. The film carrier according to claim 3, wherein said conductive passage is formed into a multi-layered structure of a plurality of metal materials.

7. The film carrier according to claim 3, wherein a thermal adhesive resin layer is provided on the surface of said insulating film on which said bump-like metal protrusion is formed.

8. A semiconductor device comprising a semiconductor element having an outer connecting electrode being connected to said bump-like metal protrusion of said film carrier as defined in claim 6.

9. The semiconductor device according to claim 8, wherein a thermal adhesive resin layer is interposed between said semiconductor element and said film carrier.

10. The semiconductor device according to claim 9, wherein said thermal adhesive resin layer is previously provided on the surface of said semiconductor element on which said outer connecting electrode is formed.

11. The semiconductor device according to claim 9, wherein said thermal adhesive resin layer is previously provided on the surface of said film carrier on which said semiconductor element is mounted.

12. The semiconductor device according to claim 9, wherein a thermal adhesive resin is introduced into the minute through-holes in that said conductive passage is not formed, thereby forming said thermal adhesive resin layer.

13. The mounting structure of a semiconductor device according to claim 12, wherein said metal material is a solder.

14. The mounting structure of a semiconductor device according to claim 12, wherein a thermal adhesive resin layer is interposed between said film carrier and said outer substrate.

15. The mounting structure of a semiconductor device according to claim 14, wherein a thermal adhesive resin is introduced between said film carrier and said outer substrate through said through-holes in that said metal material is not charged, thereby forming said thermal adhesive resin layer.

16. A semiconductor device as claimed in claim 8 wherein the device is electrically connected to a land portion of an outer substrate to provide a mounting structure, said electrical connection being provided by:
- at least one of minute through-holes in a bonding region of said insulating film where the land portion of the outer substrate is in contact therewith, or in a region of said insulating film wherein said lead is in contact therewith and in the vicinity of said region;
- a metallic material which is charged into the through-holes in said bonding region to produce a conductive passage in said insulating film; and
- a bump-like metal protrusion formed integrally with the conductive passage in the through holes in said insulating film and contacting the land portion of the outer substrate, whereby said lead is electrically connected to the land portion through said bump-like protrusion and conductive passage.

* * * * *